(12) United States Patent
Balteanu et al.

(10) Patent No.: US 8,140,028 B2
(45) Date of Patent: Mar. 20, 2012

(54) LOW NOISE RF DRIVER

(75) Inventors: Florinel G. Balteanu, Ottawa (CA); David S. Ripley, Cedar Rapids, IA (US); Atiqul Baree, London (GB); Christian Cojocaru, Ottawa (CA); Paul T. Dicarlo, Marlborough, MA (US)

(73) Assignee: Skyworks Solutions, Inc., Woburn, MA (US)

(*) Notice: Subject to any disclaimer, the term of this patent is extended or adjusted under 35 U.S.C. 154(b) by 986 days.

(21) Appl. No.: 12/117,191

(22) Filed: May 8, 2008

(65) Prior Publication Data

US 2008/0299916 A1 Dec. 4, 2008

Related U.S. Application Data

(60) Provisional application No. 60/928,785, filed on May 10, 2007.

(51) Int. Cl.
*H04B 1/66* (2006.01)
*H04B 1/04* (2006.01)
*H01Q 11/12* (2006.01)

(52) U.S. Cl. .................... 455/102; 455/127.2

(58) Field of Classification Search .................. 455/102, 455/108, 110, 127.1; 332/117, 119, 120, 332/149, 151
See application file for complete search history.

(56) References Cited

U.S. PATENT DOCUMENTS

| | | |
|---|---|---|
| 5,121,077 A | 6/1992 | McGann |
| 2002/0177420 A1 | 11/2002 | Sander et al. |
| 2002/0186440 A1 | 12/2002 | Adachi et al. |
| 2004/0219891 A1 | 11/2004 | Hadjichristos |
| 2005/0170790 A1 | 8/2005 | Chang et al. |
| 2006/0160505 A1 | 7/2006 | Ichitsubo et al. |
| 2006/0246859 A1 | 11/2006 | Rofougaran et al. |
| 2007/0298731 A1* | 12/2007 | Zolfaghari ............ 455/91 |
| 2010/0240328 A1* | 9/2010 | Nariman et al. ........ 455/102 |

* cited by examiner

*Primary Examiner* — Nguyen Vo
(74) *Attorney, Agent, or Firm* — Lando & Anastasi, LLP

(57) ABSTRACT

A low noise RF driver circuit including at least two series-coupled driver stages which receive a frequency modulated signal and an amplitude modulated signal that is applied to the supply voltage input of the driver stages, and provide a combined output signal. The RF driver circuit can be implemented in CMOS technology and integrated with other components of an RF communication subsystem, such as an RF transceiver circuit and power amplifier. Each driver stage includes a complementary pair of transistors with source degeneration resistors for linearity and gain control.

19 Claims, 8 Drawing Sheets

LOW NOISE RF DRIVER

CROSS REFERENCE TO RELATED APPLICATIONS

This application claims priority under 35 U.S.C. §119(e) to U.S. Provisional Patent Application No. 60/928,785 entitled "LOW NOISE RF DRIVER FOR POLAR LOOP ARCHITECTURE" and filed on May 10, 2007, which is herein incorporated by reference in its entirety.

BACKGROUND

1. Field of Invention

The present invention relates generally to electrical circuits and systems and, more particularly, to RF driver circuits.

2. Discussion of Related Art

Driver circuits are used in a variety of applications to control other circuit elements, such as high power transistors, power amplifiers, and the like. In particular, radio frequency (RF) drivers are used in communications systems, for example, in RF transceivers for mobile handset applications, generally to drive a power amplifier.

SUMMARY OF INVENTION

Aspects and embodiments of the invention are directed to an RF driver, such as a CMOS (complementary metal oxide semiconductor) RF driver that exhibits low noise and uses less power compared to conventional RF driver circuits. According to one embodiment, the RF driver operates below 2 volts and is suited for low power wireless applications, such as GSM/EDGE transceivers, as well as other applications where a driver is used to drive a power amplifier.

One embodiment is directed to an RF driver circuit comprising a first RF driver stage having a first signal input configured to receive a first signal, a first supply input configured to receive a second signal, and a first output, a second RF driver stage coupled in series with the first RF driver stage, the second RF driver stage having a second signal input coupled to the first output, a second supply input configured to receive the second signal, and a second output, and an AM modulator coupled to the first and second supply inputs and configured to receive an input signal and to provide the second signal, wherein the RF driver circuit is constructed and arranged to combine and amplify the first signal and the second signal and to provide at the second output an amplified output signal based thereon.

In one example, the first RF driver stage comprises a first complementary pair of FET transistors comprising a first transistor and a second transistor, a first pair of resistors including a first resistor switchably coupled between a source of the first transistor and the first output and a second resistor switchably coupled between a source of the second transistor and the first output, and a third resistor coupled between the first signal input of the first RF driver stage and the first output. In another example, the RF driver circuit further comprises a first pair of switches including a first switch coupled between the first resistor and one of the source of the first transistor and the first output; and a second switch coupled between the second resistor and one of the source of the second transistor and the first output. The first and second switches may be each actuated responsive to a first control signal. In one example, the first pair of resistors and the first pair of switches form a first source degeneration branch, and the first RF driver stage may further comprise a plurality of additional source degeneration branches coupled in parallel with the first source degeneration branch between the first transistor and the second transistor. Each of the plurality of additional source degeneration branches may comprise a pair of resistors including a fourth resistor switchably coupled between a source of the first transistor and the first output and a fifth resistor switchably coupled between a source of the second transistor and the first output. The AM modulator may comprise a regulator. In another example, the second driver stage comprises a second complementary pair of FET transistors comprising a third transistor and a fourth transistor, a second pair of resistors including a sixth resistor switchably coupled between a source of the third transistor and the second output and a seventh resistor switchably coupled between a source of the fourth transistor and the second output, and an eighth resistor coupled between the second signal input of the second RF driver stage and the second output. Any of the first, second, third and fourth transistors may be CMOS transistors. In one example, a gate of each of the first and second transistors is coupled to the first signal input. In another example, the RF driver is configured for use in an EDGE transceiver, and the first signal is a frequency modulated signal, the second signal is an amplitude modulated signal, and the output signal is a GSM/EDGE signal.

According to another embodiment, an RF transceiver system comprises an RF transceiver circuit having a transceiver output, an RF driver coupled to the transceiver output and having a driver output, and a power amplifier having an amplifier input directly coupled to the driver output. The RF transceiver circuit may be configured to provide at the transceiver output a first signal and a second signal, and the RF driver may be configured to receive and combine the first and second signals to provide a driver signal at the driver output. In one example, the RF transceiver system further comprises an AM modulator coupled between the RF transceiver circuit and the RF driver, the AM modulator being configured to receive the second signal, to apply amplitude modulation to the second signal and to provide an amplitude modulated second signal to the RF driver. As discussed above, the AM modulator may be a regular.

In one example, the first signal is a frequency modulated signal. The RF transceiver system may be a GSM/EDGE transceiver system, wherein the RF driver is configured to receive and combine the amplitude modulated second signal and the frequency modulated signal to provide the driver signal at the driver output, and wherein the driver signal is a GSM/EDGE signal. In another example, the RF driver comprises a first driver stage including a first complementary pair of FET transistors comprising a first transistor and a second transistor each having a source, a drain and a gate, a first pair of resistors including a first resistor switchably coupled between a source of the first transistor and a first output of the first driver stage and a second resistor switchably coupled between a source of the second transistor and the first output, and a third resistor coupled between an input of the first RF driver stage and the first output. The first signal may be applied to the gates of the pair of FET transistors. The amplitude modulated second signal may be applied to the drain of one of the first and second transistors. In one example, the RF driver comprises at least one additional driver stage coupled in series with the first driver stage. In another example, the RF driver comprises at least one additional driver stage coupled in parallel with the first driver stage.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

In many industries, including the wireless communications industry, there is an ever-present drive toward smaller and more complex devices such as, for example, smaller cellular telephones, personal digital assistants (PDAs) and other devices that have more features and capability. The demand for smaller mobile communication devices, coupled with demands for longer battery life and lower cost, fuel a drive toward reducing the number of "external" (i.e., not integrated with the RF transceiver) components, particularly, components that are relatively large and relatively high power. Accordingly, an RF driver according to aspects of the invention interfaces an RF transceiver circuit with an external power amplifier without requiring additional external components, such as, for example a filter, to be placed between the RF driver and the RF transceiver or power amplifier to cancel or reduce noise. Furthermore, the RF driver may consume relatively low power and may enable a reduction in the power consumption of the overall system in which it is used, as discussed further below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. For example, it is to be appreciated that although embodiments of the RF driver may be discussed below primarily in the context of a GSM/EDGE transceiver, the invention is not so limited and the embodiments of the RF driver may be used in transceivers implementing any communication standard, and also in a variety of other applications where a driver is used to drive a power amplifier. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Figure 1:
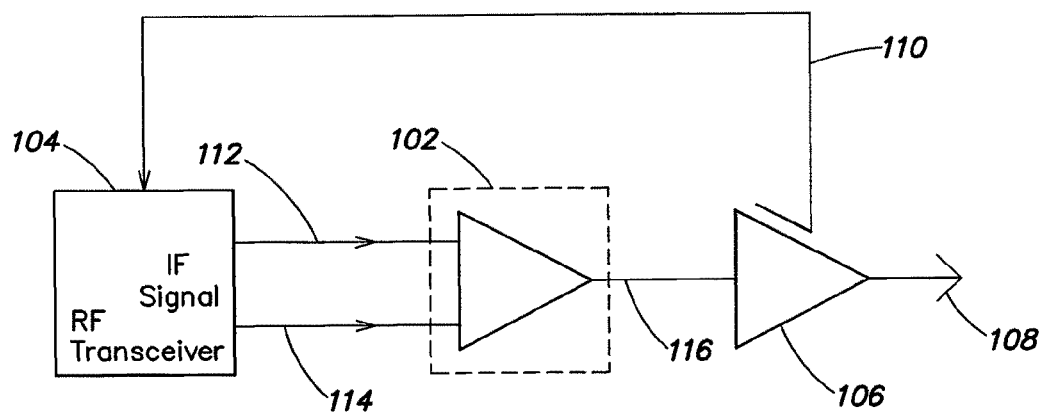
FIG. 1 is a block diagram of one example of a digital transmitter architecture incorporating an RF driver according to aspects of the invention.

Referring to FIG. 1, there is illustrated a block diagram of one example of a direct conversion transmitter architecture incorporating an RF driver 102 according to aspects of the invention. In one embodiment, the transmitter comprises an RF transceiver circuit 104 and a power amplifier 106, the RF driver 102 providing an interface between the RF transceiver circuit and the power amplifier. The power amplifier 106 provides an output RF signal at output terminal 108. A feedback signal, on line 110, may be provided from the power amplifier 106 to the RF transceiver circuit 104, as is common in direct conversion transmitter architectures. This feedback signal on line 110 may be used for power calibration, as known to those skilled in the art.

According to one embodiment, the RF driver 102 is placed between the IF (intermediate frequency) portion of the RF transceiver circuit 104 and the power amplifier 106, as illustrated in FIG. 1. With conventional driver circuits, a significant challenge is the noise level of the driver in front of the power amplifier and therefore, typically, a filter, such as a SAW (surface acoustic wave) filter, is placed in between the driver and power amplifier. The use of such a filter adds an external and bulky component, which may be presently undesirable in some applications, as discussed above, and also adds to the overall cost of the system. By contrast, embodiments of the RF driver 102 have sufficiently low noise levels such that an external filter is not required, as discussed further below. In one example, the transmitter may be used in a GSM/EDGE RF subsystem for mobile handset applications. Accordingly, the RF transceiver circuit 104 may generate two IF (intermediate frequency) signals, namely, an AM (amplitude modulated) signal on line 112 and an FM (frequency modulated) signal on line 114. The RF driver 102 may combine these two signals and provide a single GSM/EDGE signal on line 116 to the power amplifier 106.

Figure 2:
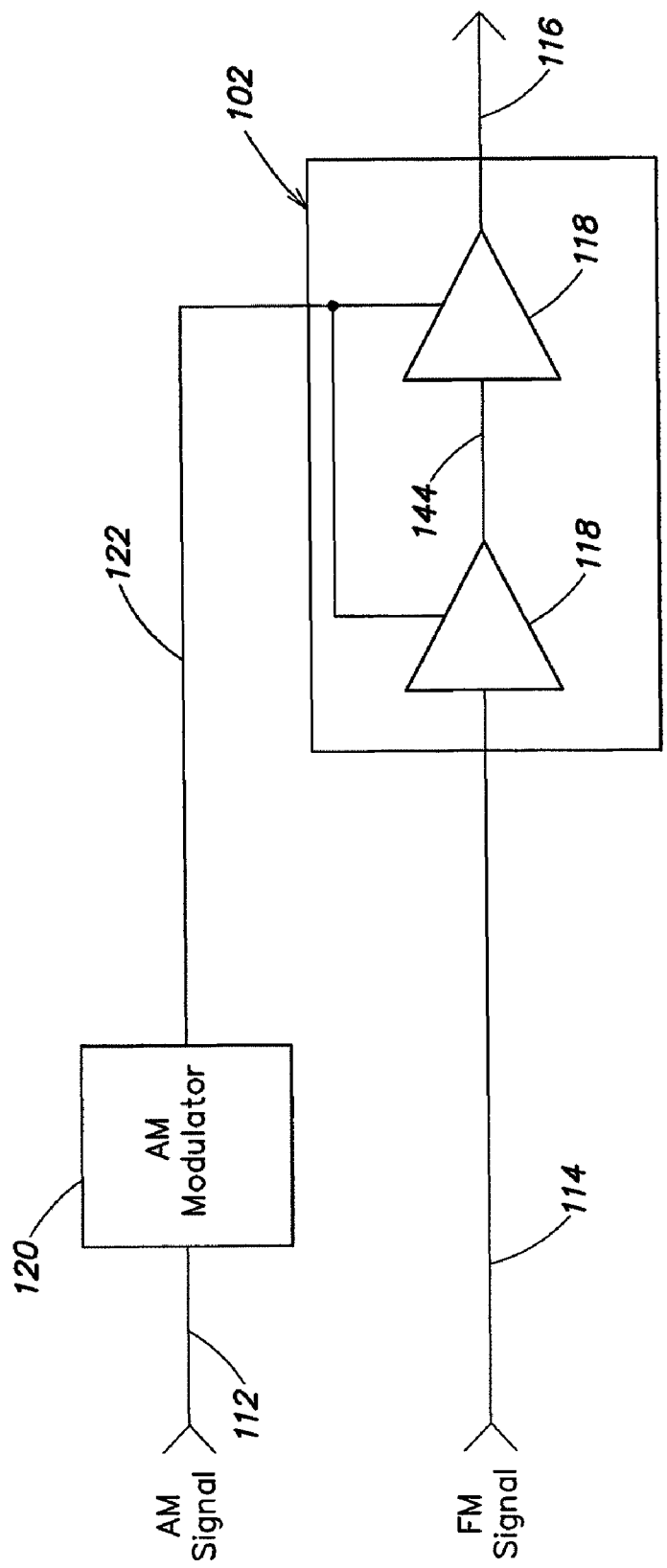
FIG. 2 is a block diagram of one example of a two-stage RF driver according to aspects of the invention.

Referring to FIG. 2, there is illustrated a block diagram of one example of a two-stage RF driver which may be used with a GSM/EDGE transceiver. In one embodiment, the RF driver 102 comprises two or more driver stages 118 coupled in series, as illustrated in FIG. 2. It is to be appreciated that embodiments of the RF driver 102 are not limited to two driver stages and may be implemented in two or more stages. More driver stages may require, of course, more power, but can be useful if a larger dynamic range is desired. The FM signal from the RF transceiver circuit 104 on line 114 may be applied to the input of the first driver stage 118 in the same way that a digital signal is applied at the input of a digital inverter, as discussed further below. The AM signal on line 112 may be applied to an AM modulator 120 which applies the amplitude modulation to the signal, as discussed further below. In one embodiment, the output from the AM modulator 120 on line 122 is applied to the voltage supply (Vcc) input of the driver stages 118 and provides the AM path to the RF driver 102. This AM path may be susceptible to thermal noise; however, because this signal path is a relatively low frequency path and the thermal noise is therefore also relatively low frequency, where such noise is undesirable, the AM path can be heavily filtered to reduce the noise.

Figure 3:
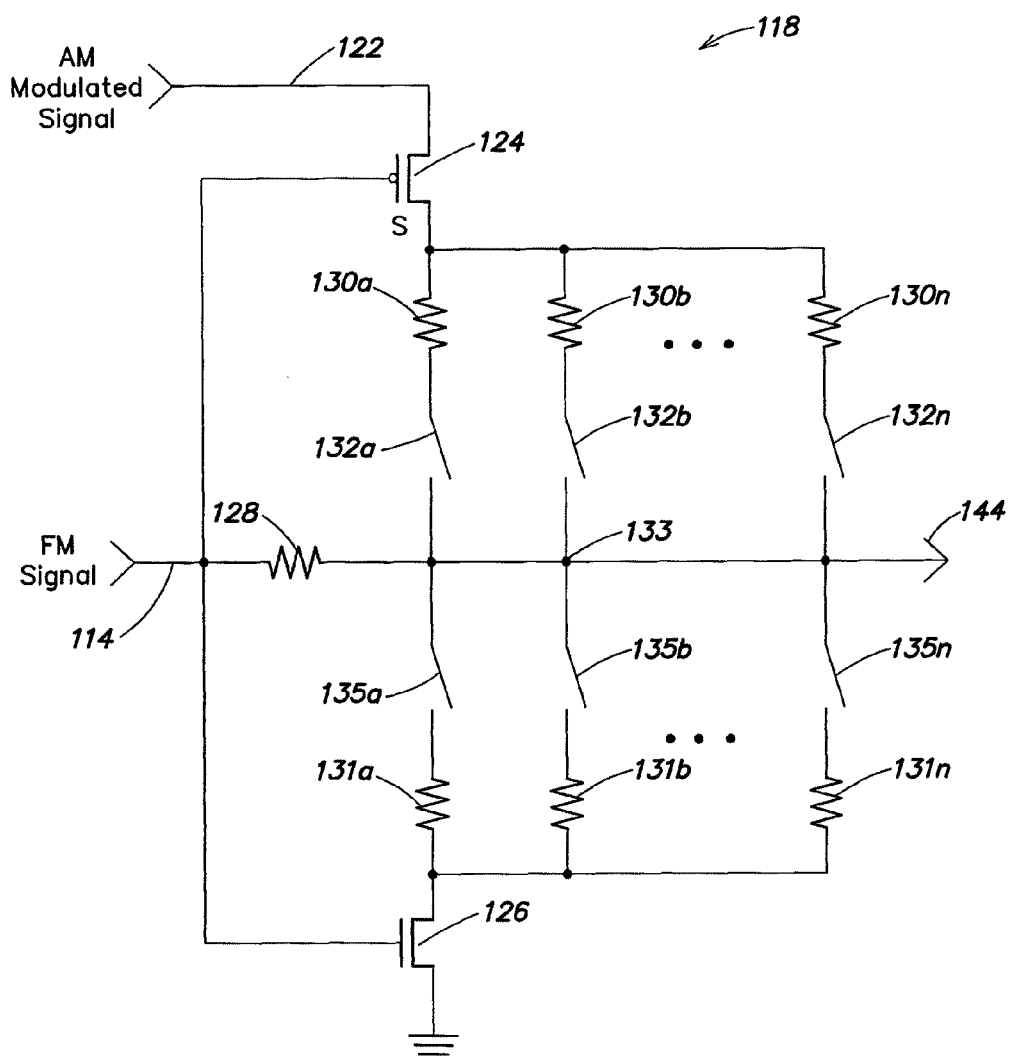
FIG. 3 is a circuit diagram of one example of a single-stage RF driver according to aspects of the invention.

Referring to FIG. 3, there is illustrated a circuit diagram of one example of a driver stage 118 that may be used to implement the RF driver 102 according to aspects of the invention. As discussed above, according to one embodiment, the RF driver stage 118 is implemented as a modified digital inverter. The driver stage 118 may include complementary transistors 124, 126, as illustrated in FIG. 3. In one example, the transistors 124, 126 may be CMOS FETs (field effect transistors) with one being an n-type FET and the other being a p-type FET. Although in FIG. 3 transistor 124 is illustrated as a p-type FET and transistor 126 is illustrated as an n-type FET, the RF driver stage 118 is not so limited. For example, transistor 124 may instead be an n-type FET and transistor 126 a p-type FET. The transistors 124, 126 may be implemented using any of a variety of transistor forms or types, provided only that the two transistors 124, 126 form a complementary pair. The use of only CMOS transistors allows the driver stage 118 to be compatible with CMOS transceiver designs. These transistors 124, 126 may act in a manner similar to that of a digital inverter.

Where the driver stage illustrated in FIG. 3 is the first driver stage in the RF driver, the FM signal on line 114 may be applied to the gates of the two transistors 124 and 126 and, via a series resistor 128, to an output terminal 144 of the first driver stage, which is also connected to an intermediate node 133 midway between the two transistors 124, 126, as shown in FIG. 3. The AM signal from the AM modulator 120 may be applied, via line 122, to the supply voltage terminal (e.g., the drain) of the first transistor 124, as illustrated in FIG. 3. The driver stage 118 may be operated using an approach that is similar to those used with saturated power amplifiers where the main power amplifier core is hardly driven. By applying the FM signal to the gates of the transistors 124, 126, the transistors are in conduction for only a short period of time and, as a result, the power efficiency is higher and the noise level low because no thermal noise is generated when the transistors are OFF.

According to one embodiment, the series resistor 128 is used to linearize the operation of the driver stage 118. In addition, in one embodiment, each of the CMOS transistors 124, 126 has source degeneration, in the form of the resistors 130, 131, which may help the linearization and may also be used to increase/decrease the power for the driver stage 118. As illustrated in FIG. 3, the source degeneration resistors 130, 131 may be provided in pairs (e.g., resistors 130a, 131a form a pair and resistors 130b, 131b form another pair) switchably connected between the intermediate node 133 and the transistors 124 and 126, respectively by switches 132, 135. When the switches 132, 135 are closed, the resistors 130, 131 are connected to and, load the output 144 of the RF driver stage 118. The number and values of the degeneration resistors 130 connected to the output 118 set the output power delivered by the driver stage 118. Two or more driver stages 118 may be connected in parallel to provide more dynamic range and/or power for the RF driver 102. For example, taps may be taken from line 114 to apply the FM signal to the input of each of the parallel driver stages 118, and the outputs 116 (or 144) of each of the parallel driver stages may be summed to provide one composite output. Each parallel driver stage 118 may have the same or different degeneration resistors (number and/or value), thus allowing flexibility in controlling power and dynamic range. As discussed above, two or driver stages may be coupled in series, as shown in FIG. 2. Therefore, it is to be appreciated that for subsequent driver stages the input signal to the stage is the output from the previous stage, and the last stage in the series will provide the output signal on line 116. For example, for two series coupled driver stages 118, as shown in FIG. 2, the signal on line 144 output from the first driver stage is applied to the gates of the two transistors 124, 126 of the second driver stage 118, and the output signal from the second driver stage is provided on line 116.

Still referring to FIG. 3, in one embodiment, a plurality of "vertical" branches of pairs of resistors (130a, 131a; 130b, 131b; ...; 130n, 131n) and their respective switches (132a, 135a; 132b, 135b; ...; 132n, 135n) are connected in parallel, as shown in FIG. 3. In one example, each vertical branch of resistors 130, 131 and switches 132, 135, for example, the branch including resistors 130a and 131a and switches 132a, 135a, may be controlled, i.e., switched into or out of connection to the transistors 124, 126, independently from every other branch. The switches 132, 135 may be operated in pairs with the switches in each vertical branch (for example, switches 132a and 135a) forming a pair, and each pair of switches being actuated by a single respective control signal. Thus, the switches of a pair (e.g., switches 132a, 135a) are actuated in tandem between the open state (in which the resistors 130, 131 in the respective branch are disconnected from the intermediate node 133) and the closed state (in which the resistors 130, 131 in the respective branch are electrically connected between the intermediate node 133 and the transistors 124, 126). It is to be appreciated that although the switches 132, 135 are illustrated in FIG. 3 as being located between the intermediate node 133 and the resistors 130, 131, respectively, the invention is not so limited and the switches 132, 135 may instead be positioned between the respective resistors and transistors (e.g., switches 132 may be connected between transistor 124 and resistors 130).

The switches 132, 135 may be actuated by signals from a microprocessor or other control device responsive to information regarding a desired gain level for the driver stage 118. The values of the resistors 130, and number of branches of resistors connected to the transistors 124, 126 set the output power delivered by the driver stage 118. Thus, the resistors 130, 131 and switches 132, 135 may provide an automatic gain control (AGC) feature for the RF driver 102. The GSM/EDGE specifications require that the RF driver have at least 30 db of AGC range to accommodate the EDGE signal, and also to have back off capabilities at low power levels. Therefore, in one example, the degeneration resistors and/or number of RF driver stages connected in series or parallel may be selected to meet these specifications.

Figure 4:
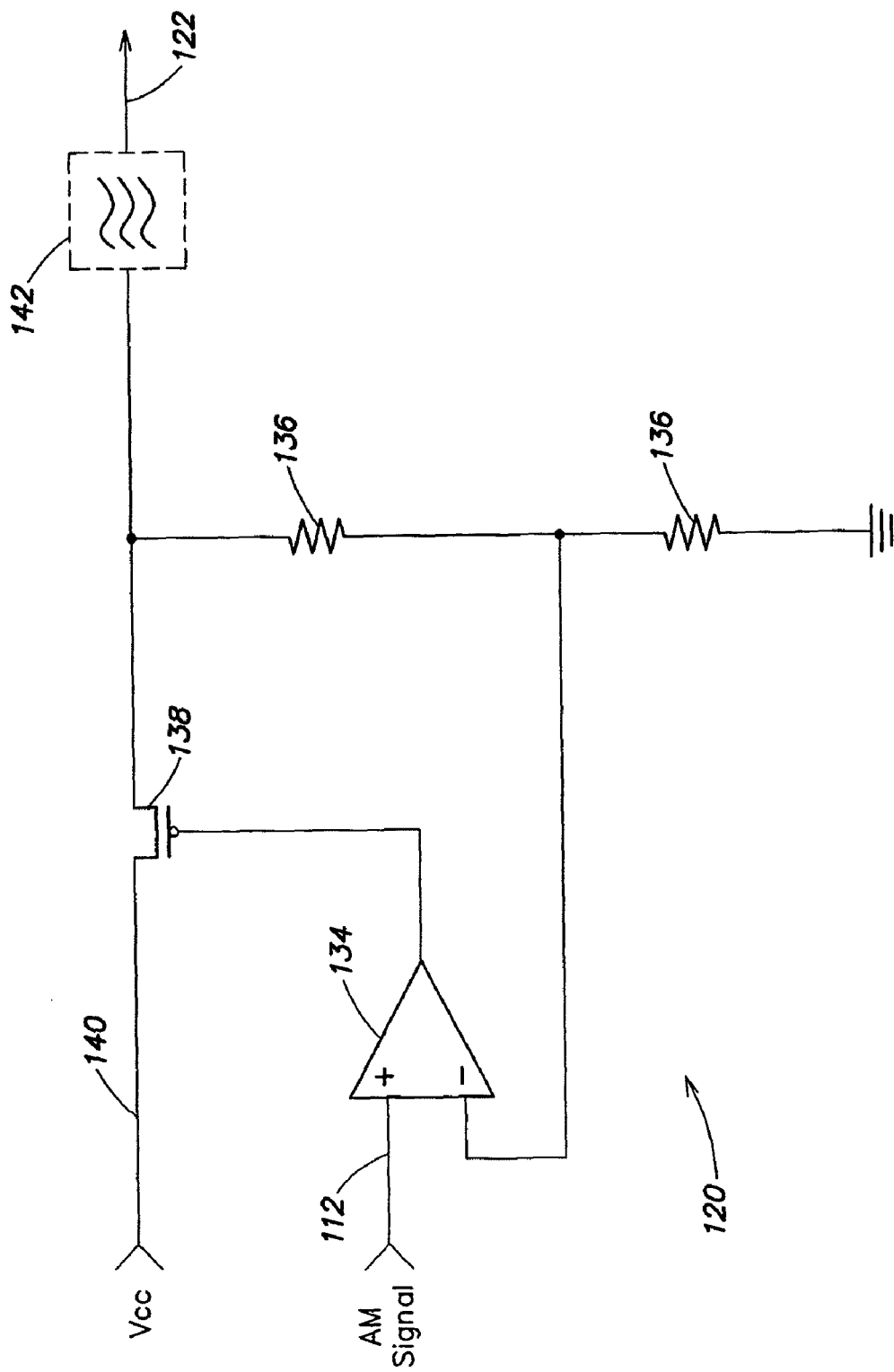
FIG. 4 is a block diagram of one example of an AM modulator according to aspects of the invention.

According to one embodiment, the AM modulator 120 which supplies the AM signal on line 122 may be a simple regulator. In one embodiment, the AM modulation path can be designed around an agile Low Dropout Regulator (LDO), as illustrated in FIG. 4. Referring to FIG. 4, in one example, the AM signal from line 112 is applied to an amplifier 134 which also receives the modulator output signal, scaled by resistors 136, as shown in FIG. 4. The output from the amplifier 134 may be provided to the gate of a transistor 138. This transistor 138 may also be a CMOS transistor. The transistor 138 receives a supply voltage, Vcc, on line 140 and supplies the AM modulator output signal on line 122. As discussed above, in one embodiment, the output of the AM modulator can be filtered using an optional filter 142 to reduce noise. The filter 142 may be selected to achieve desired noise reduction while also maintaining any necessary AM loop bandwidth. The AM modulator should have a loop bandwidth wide enough to pass the AM modulation spectrum. This may present few problems for EDGE transceivers which have relatively narrow modulation spectra, but for WCDMA transceivers where the bandwidths required can be about 10 times higher than for EDGE transceivers, the filter 142 transfer function may need to be carefully selected. In addition, the GSM technical specification requires a limit of −162 dBc/Hz on transmit noise at 20 MHz offset from the carrier. Therefore, in one example, the filter 142 can be selected to adequately suppress noise on the AM modulation path such that the RF driver 102 adds minimal noise to the RF subsystem in which it is used.

Figure 5:
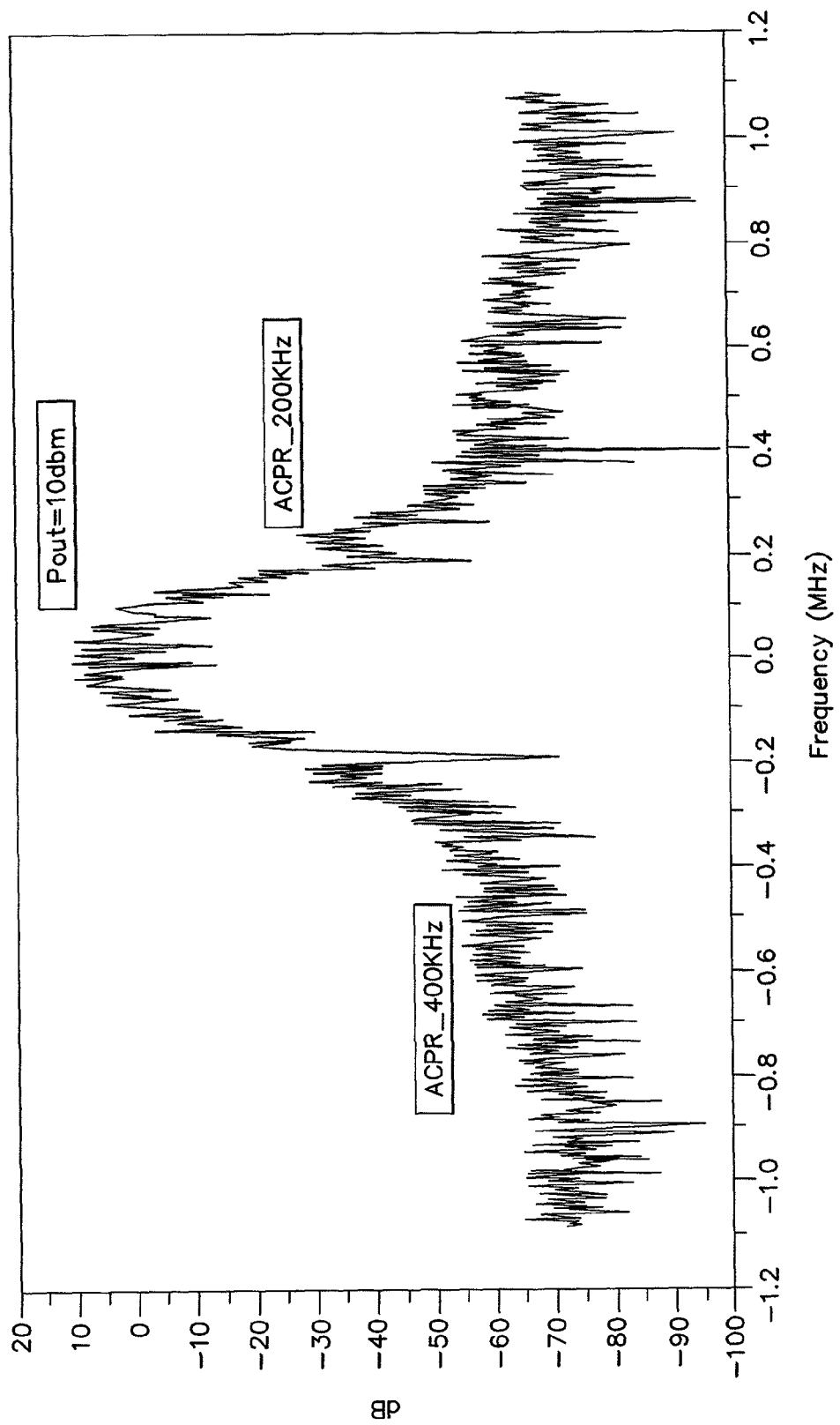
FIG. 5 is an illustration of a simulated spectral mask for one example of an RF driver according to aspects of the invention.
Figure 6:
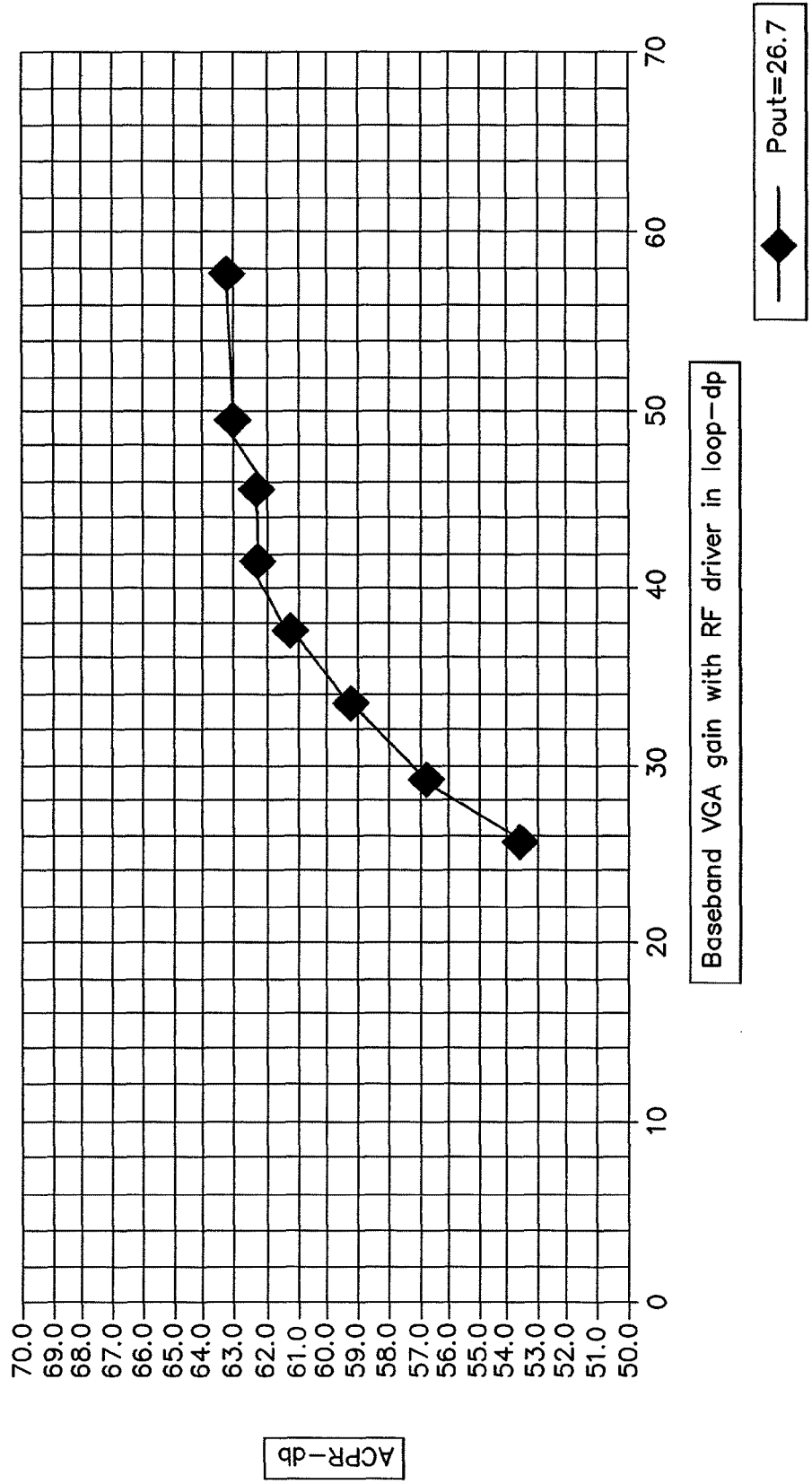
FIG. 6 is a plot of ACPR as a function of baseband VGA gain for a 400 kHz ACPR EDGE simulation with the VGA driven by an example of the RF driver according to aspects of the invention.
Figure 7:
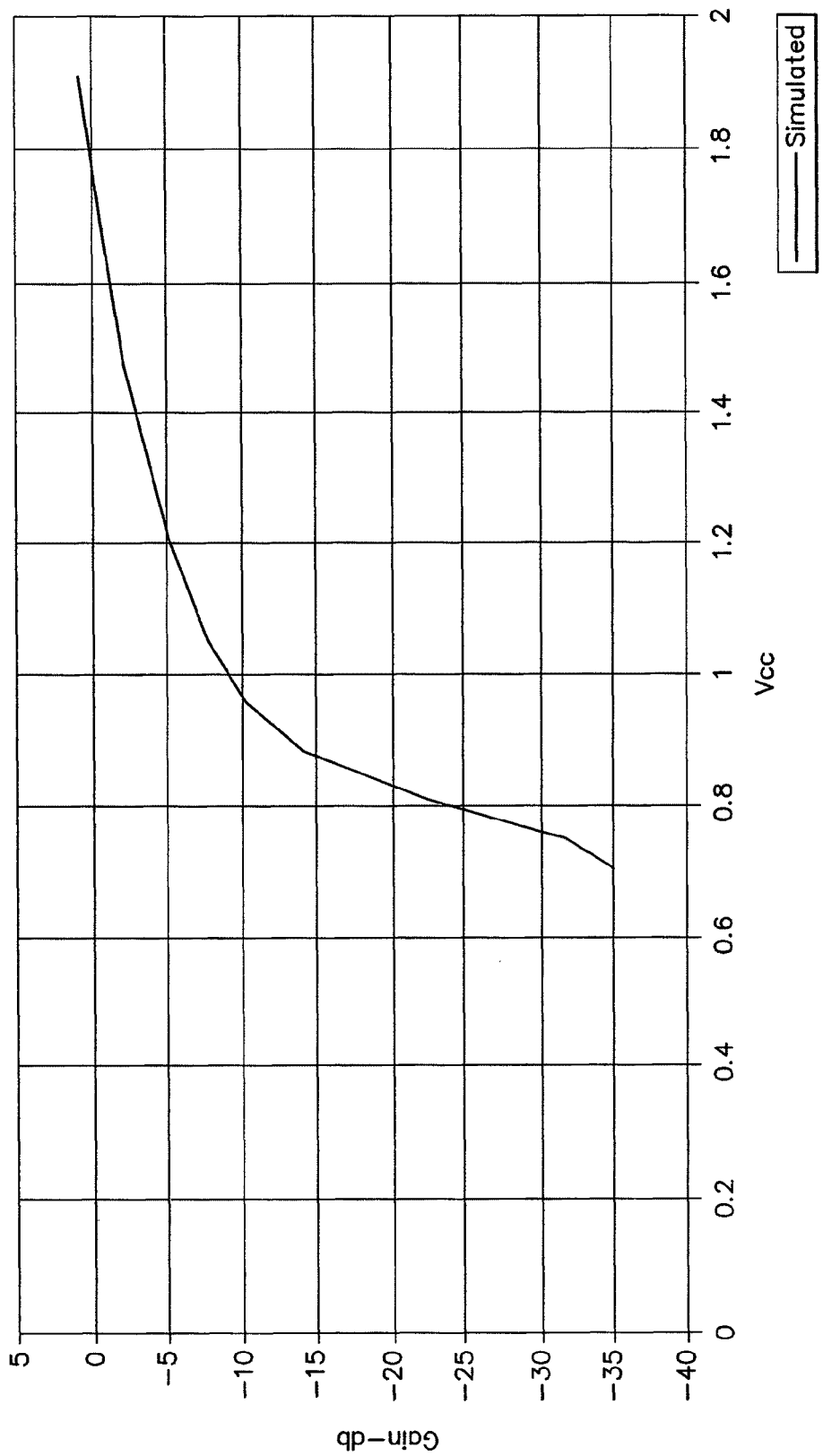
FIG. 7 is a plot of simulated gain as a function of supply voltage for one example of a single stage RF driver according to aspects of the invention.

One example of an RF driver 102 according to aspects of the invention was designed and simulated in 0.18 μm CMOS technology. Simulated performance results were obtained using a 2 GHz RF input signal. Referring to FIG. 5, there is illustrated one example of a simulated RF spectrum obtained from the RF driver 102. In this example, the ACPR (adjacent channel power ratio) at 200 KHz for an EDGE signal is −42 dB and at 400 KHz is −65 dB, which meet the spectral requirements specified for current EDGE transceivers. FIG. 6 illustrates a plot of the ACPR in dB as a function of baseband variable gain amplifier (VGA) gain (in dB) for a 400 kHz ACPR EDGE simulation, with an example of the RF driver used to driver the VGA. The simulations also showed that the RF driver 102 may provide about 5-10 dBm RF power into a 50 Ohm load. FIG. 7 illustrates a plot of the gain of a simulated single stage RF driver in dB as a function of the supply voltage. The higher the power delivered by the RF driver 102, the less gain may be needed for the power amplifier 106, which may reduce the noise associated with the power amplifier. In one example, the RF driver 102 can deliver a maximum power level of about 7 dBm to a 50 Ohm load, with a linearity of approximately −63 dBc, a maximum current consumption of about 13 mA and a noise level of about −171 dBc/sqrHz (dB below carrier per square-root-Hertz). In another example, the RF driver 102 comprised two driver stages 118, as illustrated in FIG. 2, and each of the series driver stages 118 drew less than about 13 mA for about 6.7 dBm delivered into a single-ended 50 Ohm load. Current consumption may be reduced for lower output power levels. In addition, one simulated example of the RF driver has a dynamic range of about 35 dB, which is sufficient for EDGE modulations and also for lower power GSM mode operation.

Figure 8:
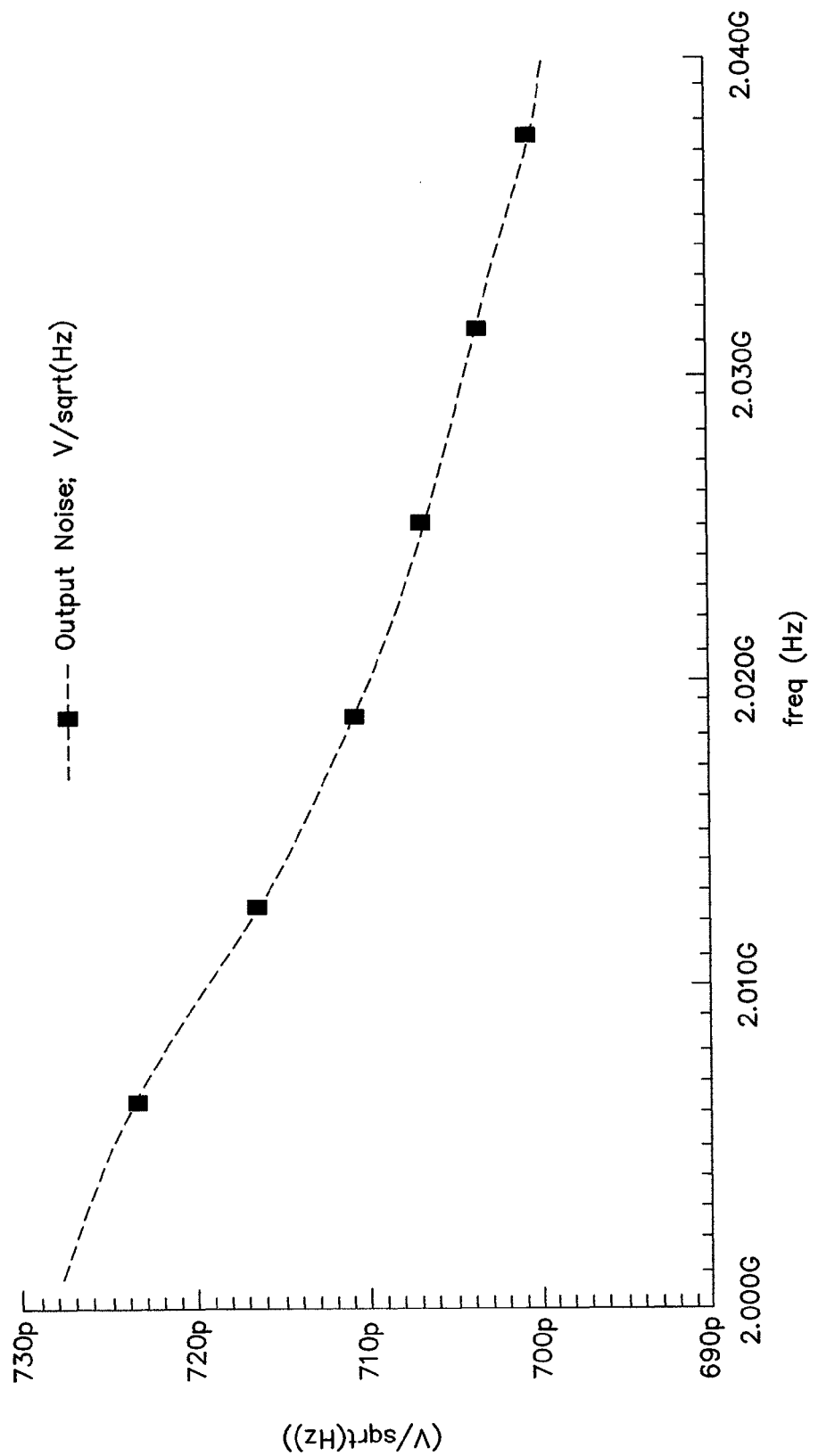
FIG. 8 is a plot of a simulated periodic noise response for one example of an RF driver according to aspects of the invention.

Referring to FIG. 8, there is illustrated a noise simulation for an example of the RF driver 102 at 5 dBm output power. As shown in FIG. 7, the noise level is below 1 nV/rtHz (nanovolt per root-Hertz) over the simulated frequency range of about 2 GHz to about 2.04 GHz, which translates into a noise level of about −170 dBc/Hz (well with the EDGE/GSM specifications). In addition, this low noise level presently does not require an external SAW filter between the RF transceiver circuit 104 (or RF driver 102) and the power amplifier 106 (as may be typically required in conventional systems). As discussed above, elimination of bulky external components, such as a SAW filter, may be highly desirable in some applications, including mobile handset applications in which size, weight and cost may be important considerations.

In summary, embodiments of an RF driver suitable for use in a GSM/EDGE/WCDMA transceiver, as well as other applications, have been described. Examples of the RF driver 102 have very low noise performance for 5-10 dBm simulated output power, and also offer very good linearity performance, as illustrated in ACPR simulations. As discussed above, the RF driver may be implemented in CMOS technology, making it suitable for integration with an RF transceiver circuit 104 and power amplifier 106 on a single chip. Furthermore, although examples of the RF driver have been simulated in 180 nm CMOS technology, the design is scalable and may be easily ported into more advanced low feature CMOS technologies, such as 65 nm and 45 nm CMOS technologies. In particular, as discussed above, in one embodiment, the RF driver 102 uses an architecture similar to that of a digital inverter which is suitable for scaling into low feature CMOS technologies, unlike analog RF circuits which are typically not easily scalable and may present difficulties to implementation in new CMOS technologies. Furthermore, the ability to interface embodiments of the RF driver 102 directly with the power amplifier 106 without using a SAW filter translates into higher overall system efficiency. As discussed above, adding additional RF driver stages 118 in parallel and/or series may allow one to extend the dynamic range and/or output power level provided by the RF driver 102 while maintaining very low noise levels and avoiding the use of a SAW filter between RF driver 102 and the power amplifier 106.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:
1. An RF driver circuit comprising:
a first RF driver stage having a first signal input configured to receive a first signal, a first supply input configured to receive a second signal, and a first output, the first RF driver stage including:
a first complementary pair of FET transistors comprising a first transistor and a second transistor;
a first pair of resistors including a first resistor switchably coupled between a source of the first transistor and the first output and a second resistor switchably coupled between a source of the second transistor and the first output; and
a third resistor coupled between the first signal input of the first RF driver stage and the first output;
a second RF driver stage coupled in series with the first RF driver stage, the second RF driver stage having a second signal input coupled to the first output, a second supply input configured to receive the second signal, and a second output; and
an AM modulator coupled to the first and second supply inputs and configured to receive an input signal and to provide the second signal;
wherein the RF driver circuit is constructed and arranged to combine and amplify the first signal and the second signal and to provide at the second output an amplified output signal based thereon.
2. The RF driver circuit as claimed in claim 1, further comprising a first pair of switches including a first switch coupled between the first resistor and one of the source of the first transistor and the first output; and a second switch coupled between the second resistor and one of the source of the second transistor and the first output.

3. The RF driver circuit as claimed in claim 2, wherein the first and second switches are each actuated responsive to a first control signal.

4. The RF driver circuit as claimed in claim 3, wherein the first pair of resistors and the first pair of switches form a first source degeneration branch, and the first RF driver stage further comprising a plurality of additional source degeneration branches coupled in parallel with the first source degeneration branch between the first transistor and the second transistor; each source degeneration branch of the plurality of additional source degeneration branches including a pair of resistors including a fourth resistor switchably coupled between a source of the first transistor and the first output and a fifth resistor switchably coupled between a source of the second transistor and the first output.

5. The RF driver circuit as claimed in claim 4; wherein the second driver stage comprises:
a second complementary pair of FET transistors comprising a third transistor and a fourth transistor;
a second pair of resistors including a sixth resistor switchably coupled between a source of the third transistor and the second output and a seventh resistor switchably coupled between a source of the fourth transistor and the second output; and
an eighth resistor coupled between the second signal input of the second RF driver stage and the second output.

6. The RF driver circuit as claimed in claim 1, wherein the first and second transistors are CMOS transistors.

7. The RF driver circuit as claimed in claim 1, wherein a gate of each of the first and second transistors is coupled to the first signal input.

8. The RF driver circuit as claimed in claim 7, wherein the RF driver is configured for use in an EDGE transceiver with the first signal being a frequency modulated signal, the second signal being an amplitude modulated signal, and the output signal being a GSM/EDGE signal.

9. The RF driver circuit as claimed in claim 1, wherein the AM modulator comprises a regulator.

10. An RF transceiver system comprising:
an RF transceiver circuit having a transceiver output and configured to provide at the transceiver output a frequency modulated first signal and a second signal;
an AM modulator coupled to the RF transceiver circuit and configured to receive the second signal, to apply amplitude modulation to the second signal and to provide an amplitude modulated second signal;
an RF driver coupled to the AM modulator and to the transceiver output and having a driver output, the RF driver being constructed and arranged to combine and amplify the frequency modulated first signal and the amplitude modulated second signal and to provide at the driver output a driver signal based thereon, the RF driver including:
a first RF driver stage having a first signal input configured to receive the frequency modulated first signal from the RF transceiver circuit, a first supply input configured to receive the amplitude modulated second signal from the AM modulator, and a first output; and
a second RF driver stage coupled in series with the first RF driver stage, the second RF driver stage having a second signal input coupled to the first output, a second supply input configured to receive the amplitude modulated second signal, and the driver output; and
a power amplifier having an amplifier input directly coupled to the driver output.

11. The RF transceiver system as claimed in claim 10, wherein the RF transceiver system is a GSM/EDGE transceiver system and
the driver signal is a GSM/EDGE signal.

12. An RF transceiver system comprising:
an RF transceiver circuit having a transceiver output;
an RF driver coupled to the transceiver output and having a driver output, the RF driver having a first driver stage including:
a first complementary pair of FET transistors comprising a first transistor and a second transistor each having a source, a drain and a gate;
a first pair of resistors including a first resistor switchably coupled between a source of the first transistor and a first output of the first driver stage and a second resistor switchably coupled between a source of the second transistor and the first output; and
a third resistor coupled between an input of the first RF driver stage and the first output; and
a power amplifier having an amplifier input directly coupled to the driver output.

13. The RF transceiver system as claimed in claim 12, wherein the RF transceiver circuit is configured to provide at the transceiver output a first signal and a second signal, and the RF driver is configured to receive and combine the first and second signals to provide a driver signal at the driver output.

14. The RF transceiver system as claimed in claim 13, further comprising an AM modulator coupled between the RF transceiver circuit and the RF driver, the AM modulator being configured to receive the second signal, to apply amplitude modulation to the second signal and to provide an amplitude modulated second signal to the RF driver.

15. The RF transceiver system as claimed in claim 14, wherein the first signal is a frequency modulated signal.

16. The RF transceiver system as claimed in claim 12, wherein the first signal is applied to the gates of the pair of FET transistors.

17. The RF transceiver system as claimed in claim 16, wherein the amplitude modulated second signal is applied to the drain of one of the first and second transistors.

18. The RF transceiver system as claimed in claim 12, wherein the RF driver comprises at least one additional driver stage coupled in series with the first driver stage.

19. The RF transceiver system as claimed in claim 12, wherein the RF driver comprises at least one additional driver stage coupled in parallel with the first driver stage.

* * * * *